United States Patent [19]

Robinson

[11] Patent Number: 5,147,740
[45] Date of Patent: Sep. 15, 1992

[54] STRUCTURE AND PROCESS FOR FABRICATING CONDUCTIVE PATTERNS HAVING SUB-HALF MICRON DIMENSIONS

[75] Inventor: Gerald D. Robinson, Westlake Village, Calif.

[73] Assignee: Rockwell International Corporation, Seal Beach, Calif.

[21] Appl. No.: 564,996

[22] Filed: Aug. 9, 1990

[51] Int. Cl.$^5$ ............................................. G03F 9/00
[52] U.S. Cl. ....................................... 430/5; 430/311; 430/312; 430/313; 430/315; 430/325; 430/326; 430/330
[58] Field of Search ................. 430/5, 311, 312, 313, 430/315, 325, 326, 330

[56] References Cited

U.S. PATENT DOCUMENTS 4,631,249  12/1986  Kalyanaraman ................. 430/312
4,814,258   3/1989  Tam ................................. 430/312

FOREIGN PATENT DOCUMENTS 0081406  2/1989  Japan .
0081408  2/1989  Japan .
0153423  4/1991  Japan .

OTHER PUBLICATIONS

Pedrotti et al., "A Novel Optical Lithographic Process for Fabrication of Sub-Half-Micron Schottky Barrier Gate Structures", Journal of Vacuum Science Technology, vol. B7(4), pp. 675-679, (Jul./Aug. 1989).

Lin, "Portable Intimately Contacted Mask", IBM Technical Disclosure Bulletin, vol. 21, No. 5, Oct. 1978.
Lahiri et al., "Two Component Photoresist Process for Conductors", IBM Technical Disclosure Bulletin, vol. 26, No. 11, Apr. 1984.
Nolscher et al., Evaluation of Multilayer Resists for Submicron Technology, in Advances in Resist Technology and Processing V, SPIE vol. 920, pp. 437-445 (SPIE 1988).

Primary Examiner—Charles L. Bowers, Jr.
Assistant Examiner—Thomas R. Neville
Attorney, Agent, or Firm—Wilfred G. Caldwell; John J. Deinken

[57] ABSTRACT

A mask and lithographic process is disclosed for the formation of conductive patterns on substrates, particularly in connection with the formation of high electron mobility transistors (HEMT) and metal-semiconductor field effect transistors (MESFET). The technique allows the formation of sub-half micron conductive patterns on semiconductor substrates using optical lithography and a multilayer portable conformable mask. The method includes the application of optical contact lithography to a conventional photoresist followed by a deep UV flood exposure of an underlying multilayer PMGI portion. Metal is deposited on a semiconductor substrate through the mask formed by the photoresist and PMGI layers to produce sub-half micron conductive patterns.

7 Claims, 2 Drawing Sheets

STRUCTURE AND PROCESS FOR FABRICATING CONDUCTIVE PATTERNS HAVING SUB-HALF MICRON DIMENSIONS

GOVERNMENT INTEREST

This invention was made with U.S. Government support under Contract No. N66001-86-C-0381 awarded by the U.S. Department of the Navy. The U.S. Government has certain rights in this invention.

BACKGROUND OF THE INVENTION

The present invention relates to a method for forming conductive lines and patterns and more particularly to a lithographic method for producing sub-half micron gate structures in electronic devices.

In the manufacture and production of electronic devices, and, more particularly, in the manufacture of semiconductor devices including high electron mobility transistors (HEMT) and metal-semiconductor field effect transistors (MESFET), there is a need for higher density devices for microelectronic applications. This demands development of techniques for defining ever finer features including conductive patterns for semiconductor interconnections such as Schottky barrier gate structures.

Various types of lithography are used for such microelectronic applications including conventional optical lithography, electron beam lithography (EBL) and x-ray lithography (XRL). It has been generally assumed that as the definition of sub-half micron features are desired in processes used for depositing metal patterns on semiconductors, the inherent limitations of optical lithography preclude its use in defining sub-half micron patterns. It has therefore been assumed that miniaturization requires the use of EBL and XRL techniques if such dimensions are to be achieved.

While EBL and XRL processes can achieve the line definitions desired for sub-half micron applications, these techniques require a major capital investment in equipment over that normally used in optical lithographic processes. Furthermore, when using EBL or XRL systems, there are other limitations in the applications of those methods which are time consuming and costly and thereby restrict their application in the production of integrated circuits.

By way of example, in EBL systems producing submicron structures in electron beam sensitized polymethylmethacrylate (PMMA) the procedure is time consuming and requires many hours to expose the fine line of patterns. This limits turn around time and increases the costs of production. Furthermore, in submicron structures only thin layers of PMMA can be used which severely limits the metal lifting capability for producing optimum low resistance Schottky barrier gates. Since such gates require a metal thickness in the order of 1 micron (10,000 Å) and the PMMA layers are in the order of 2,000 Å to 3,000 Å thickness, the use of EBL requires elaborate multilevel resist structures and electroplating processes to achieve the metal thickness required for thick metal lifting.

Another difficulty that is encountered as the conducting line widths are decreased in microelectronic circuits relates to the conductive characteristics of the sub-half micron materials. Although small dimensions of the conductive depositions are desirable for optimizing device performance, of equal importance is the electrical resistance of the depositions, particularly in forming gate structures. Specifically, as the gate dimensions are decreased, the gate thickness must be increased exponentially to provide the low resistance required for optimum performance of the devices. In those processes using conventional EBL and XRL techniques, the cross sections formed by the lithographic process are often not sufficient to provide the thickness required to achieve the low resistance conduction characteristics needed for the electronic devices. There is therefore a continuing need for techniques which will allow additional reduction in the dimensions of the conductive structures using inexpensive equipment and procedures without significantly impacting the performance requirements of the resulting devices.

Accordingly, the present invention has been developed to overcome the above known and similar shortcomings and to provide a structure and technique for allowing the practice of optical lithography for producing sub-half micron conductive patterns in electronic devices.

SUMMARY OF THE INVENTION

In accordance with the present invention, a portable conformal mask structure is employed in a lithographic technique to enable the production of sub-half micron conductive patterns on semiconductor devices. This process allows conventional metal lift-off to define the patterns while retaining low resistance, particularly in gate structures to optimize the performance of the resulting devices. The mask structure is formed by depositing a first portion of multiple layers of poly-(dimethylgutarimide) (PMGI) on a semiconductor substrate. The multilayer PMGI is formed by depositing a plurality of layers of different dilutions of PMGI over one another to form the PMGI portion of the mask structure. The layers are deposited so that each successive layer has an increased concentration of PMGI from that previously deposited. A conventional photoresist layer is then deposited as a second portion over the top layer of the PMGI to define a portable conformable mask over the semiconductor substrate.

The mask structure is then subjected to optical contact lithography to define a pattern within the photoresist representing the desired pattern of the conductive deposition to be achieved on the substrate. After development of the photoresist, the first multilayer PMGI portion is subjected to a flood exposure of radiation to define an exposure pattern corresponding to the pattern developed in the photoresist. The dimensions of the pattern in the photoresist are selected and coordinated with the wavelength of the flood exposure and the subsequent development time of the PMGI to produce sub-half micron openings in the PMGI layer exposing the substrate.

The conductive pattern is defined by depositing metal in the mask structure formed by the first and second portions and results in the creation of a tapered conductive pattern having a sub-half micron base contacting the semiconductor substrate which increases in width over the thickness of the deposition. The conductive pattern is completed by employing a conventional metal lift-off process which is accomplished by removing the photoresist and the metal overlaying that layer. The PMGI portion may then be removed or left in place, depending upon the structure which is being formed, to provide support for the resulting conductive pattern. The resulting conductive pattern has a sub-half micron width and a thickness and tapered wall which facilitates conventional metal lift-off and produces a conductive resistance, particularly in gate structures, necessary to provide the greater current carrying capability required by specific devices.

It is therefore a feature of the invention to provide an improved mask structure for defining conductive lines or patterns on substrates.

Yet a further feature of the invention is to provide a mask structure which allows optical lithographic processes to be practiced in the formation of sub-half micron conductive patterns on semiconductor substrates.

It is a further feature of the invention to provide a multilayer mask structure which enables the definition of conductive sub-half micron patterns on semiconductor substrate using an upper level pattern defined using conventional optical lithographic techniques to define a corresponding pattern in a lower multilayer level portion which produces a sub-half micron pattern on the substrate.

Another feature of the invention is to provide an optical lithographic technique for developing a mask pattern having a sub-half micron base width with tapered walls increasing in width from the base.

Still another feature of the invention is to provide an optical lithographic technique which allows the deposition of a conductive pattern having a sub-half micron width and sufficient thickness to allow metal lift-off to define the conductive pattern.

Yet another feature of the invention to provide an optical lithographic process for producing a Schottky barrier gate structure using a dual layer mask including an upper level pattern and a multilayer lower level portion which defines a pattern capable of allowing the deposition of a conductive pattern having a sub-half micron base and tapered walls increasing from the base to produce a low resistant gate.

These and other advantages and novel features of the invention will become apparent from the following detailed description when considered with the accompanying drawings wherein:

DETAILED DESCRIPTION OF A PREFERRED EMBODIMENT

Figure 1A:
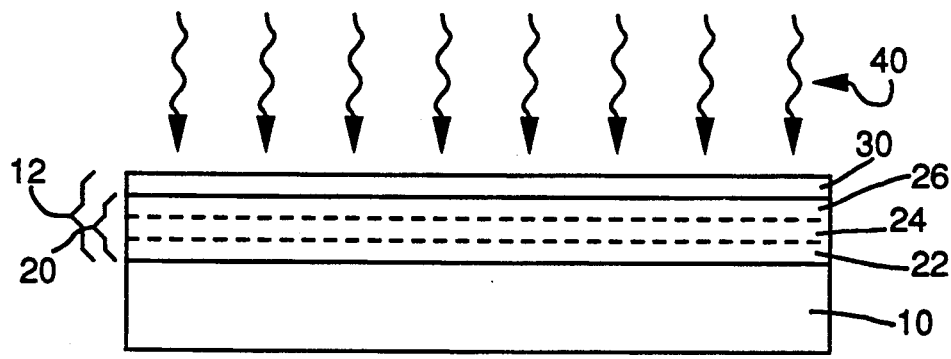
FIGS. 1A–1G illustrate a preferred embodiment of the mask structure and method for fabricating a sub-half micron conductive pattern on a substrate in accordance with the present invention.

Referring now to the drawings, where like numerals are used to depict like elements throughout, FIG. 1A shows a bi-level photoresist structure formed in accordance with the present invention and used to define sub-half micron patterns on a substrate using optical lithography. More specifically, there is shown a substrate 10 which in the present instance is a semiconductor substrate such as GaAs or InP which is suitable for forming HEMT and MESFET structures. However, the substrate 10 may be formed of any material on which it is desired to produce a sub-half micron pattern in accordance with the present invention. The substrate 10 may be formed using a variety of conventional techniques depending on the semiconductor device, integrated circuit or electronic structure to be formed, including such techniques as molecular beam epitaxy or metal-organic chemical vapor deposition. The particular construction of the substrates used in connection with the practice of the invention will not be further described since its application in connection with the invention will be understood by those skilled in the art.

Referring still to FIG. 1A, the substrate 10 is covered by a bi-level mask structure 12 which includes a lower level first portion 20 and an upper level second portion 30. The lower level 20 is formed as a multilayer second portion depicted as three layers 22, 24, 26. The portion 20 may be formed by depositing three successive layers of PMGI of varying dilutions over one another to define the three-layer lower level 20. The portion 20 may be formed, for example, using, SAL-101 PMGI obtained from Shipley.

The upper level second portion 30 is deposited over and covers the first level 20 and may be formed as a layer of conventional positive photoresist such as a Shipley 1400–27 or equivalent. The multilayer lower level 20 and the upper level 30 form a multilayer portable conformable mask (PCM) which can then be used as described below to form sub-half micron lines or patterns using optical lithography to enable a deposition of sub-half micron patterns on the substrate 10.

Figure 1B:
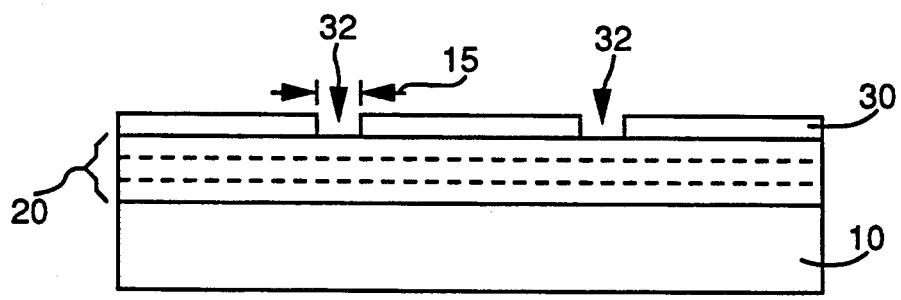

In accordance with one embodiment of the inventive technique, a pattern on the upper level 30 is developed using conventional contact optical lithographic procedures. Specifically, the upper level positive photoresist layer 30 may be exposed to radiation 40 through a conventional quartz photoplate with a pattern defined in the etched chrome and achieved with the photoplate in vacuum contact with the mask coated substrate using a highly collimated light source. This is a conventional procedure which is used for the photolithographic processing typically required in the fabrication of GaAs or InP integrated circuits. The exposed resist pattern formed in portion 30 may be subsequently developed in the conventional manner to produce openings 32 which will define a pattern that will correspond to the desired pattern of conductive deposition on the substrate 10. The pattern of openings 32 having width 15 is generally shown in FIG. 1B in upper level 30 after exposure and development of the positive resist 30.

Figure 1C:
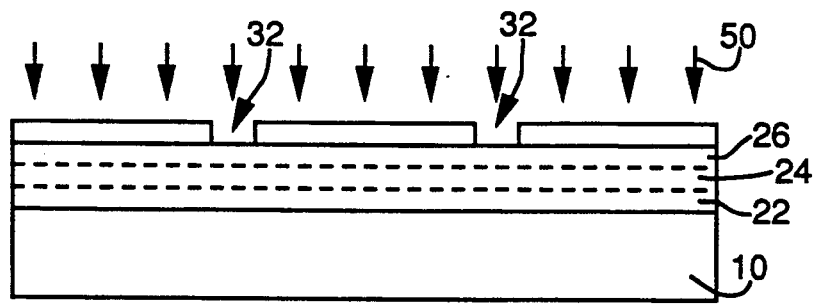

Referring now to FIG. 1C, following the conventional exposure and development of the upper level photoresist 30 (imaging layer) the underlying lower level multilayer portion 20 may then be exposed using a flood exposure of radiation 50. The upper imaging layer 30 is selected to be of a material which is opaque to the flood exposure 50 and thus acts as a portable conformal mask for exposing the lower level multilayer 20 through the openings 32 in the upper level imaging resist 30. The upper level layer 30 is also selected so that the chemistry of the upper level 30 is dissimilar from that of the lower level 20 so that the chemical development or dissolution of one has no effect on the other.

Figure 1D:
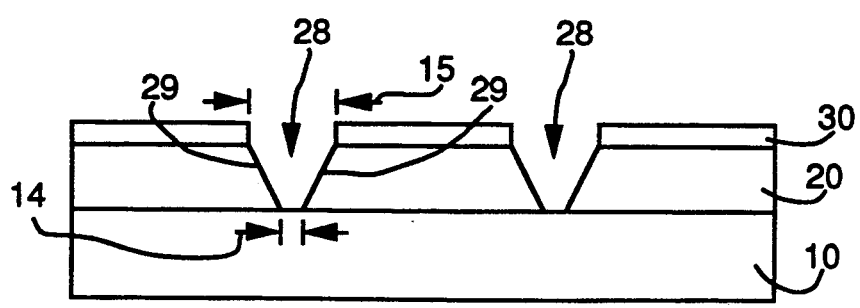

In the present embodiment, the multilayer lower level 20 is shown as three diluted layers 22, 24, and 26 of PMGI, each of which is formed as a layer of PMGI with a different concentration by providing a slurry of PMGI having a specific ratio of PMGI to solvent for each layer. Each layer, starting with the layer 22 adjacent to the substrate 10, successively increases in concentration. As the dilution ratio (PMGI: solvent) is increased, the relative development time or dissolution time decreases. As a result, the deep flood radiation 50 of the lower level 20 coupled with the natural phenomenon of Kirchhoff diffraction of the radiation 50 through pattern 32, creates an exposure of the lower level 20 which produces a zone at the interface of the lower level 20 and substrate 10 having a sub-half micron width and tapering to the width of the pattern 32 in the imaging layer 30. The dilution and formation of the multilayers of portion 20 is selected to produce a development which creates a tapered opening 28 defining a sub-half micron width 14 at the interface of the substrate having tapered walls 29 opening upwardly to the width 15 of the pattern 32 as shown in FIG. 1D.

Figure 1E:
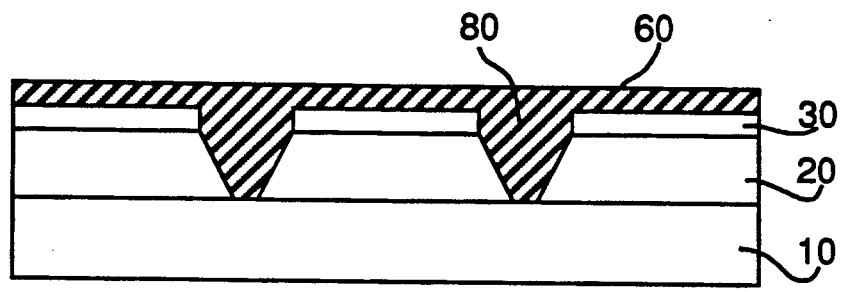

Turning now to FIG. 1E, after development of the lower level multilayer 20, a conductive material 60 is deposited over the mask 12 and through the upper level 30 to produce a pattern of conductive portions 80 on the substrate 10 and having a sub-half micron width 14. The thickness of the metal portion 80 is determined by the thickness of the mask 12 and may typically be approximately 1–3 microns. The conductive portion 80 contacts the substrate 10 only along the deep narrowly defined sub-half micron opening defined in the lower level 20 adjacent to the substrate 10. This configuration produces the desired sub-half micron width 14 but permits, by virtue of the tapered wall structure created by the lower level 20, the creation of tapered conductive portion 80. This tapered configuration increases the wall thickness of 80 and produces an increased resistance necessary in the formation of certain gate structures and assists in the metal lift-off described below in connection with FIG. 1F.

The desired conductive pattern may then be completed by removing the resist 30 and lifting the metal in a conventional fashion to produce the conductive portions 80 in the desired pattern through the lower level 20. Because the chemistry of the portions 30 and 20 are different, photoresist 30 may be dissolved without affecting the lower level layer 20. Moreover, the resulting conductive pattern 80 on the substrate 10 has the strength and resistance characteristics necessary for the particular electronic device or integrated circuit in which the structure will be used. Depending then upon the usage, the structure shown in FIG. 1F may be further processed with the portion 20 left in place to support the fragile sub-half micron pattern 80 on the substrate 10. This will permit the processing of the substrate while reducing the danger of damaging the conductive portions 80 during such processing. Alternatively, the lower level 20 may be dissolved in accordance with the final processing of the device for the ultimate manufacture of the desired electronic structure.

In one specific example of the practice of the present invention, the described mask structure 12 was used in the practice of an optical lithographic process for fabricating sub-half micron Schottky barrier gate structures on a GaAs substrate 10. The lower level multilayer 20 was formed as a three layer level of SAL-101 PMGI from Shipley. The first layer 22 of PMGI was diluted 3 to 1 (3 parts PMGI to 1 part solvent) and deposited on the GaAs substrate and baked at 250° for 30 minutes to form a layer thickness of approximately 3000–3500Å. The next layer 24 was formed as a PMGI layer diluted 4 to 1 and applied to the prior layer 22 and baked at 190° C. for 30 minutes to form a layer thickness of approximately 4000–4500Å. The third layer 24 was formed as a PMGI layer diluted 5 to 1 and also baked at 30 minutes at 190° C. to form a layer thickness of approximately 5000–5500Å. The effect of the dilution and bake times was to produce a slower development rate in those layers having a greater dilution and higher bake temperatures resulting in a faster dissolution rate of the upper layers to enhance the wall taper in the lower level 20 as previously described in connection with FIG. 1D. While the dilution enhances the control over the development of the layer, multiple layers must be used to build sufficient thickness because of the low viscosity of the diluted PMGI.

After formation of the lower level portion 20, the imaging layer 30 was deposited as a Shipley 1400-27 positive photoresist and baked for 30 minutes at 90° C. to form a layer thickness of approximately 12,000Å. Thereafter, the resulting mask structure 12 was exposed using a Karl Suss MA-56, MJB3 or equivalent contact aligner to develop the pattern in the upper level 30. This produced mid UV (320 nm) radiation 40 which defined the desired pattern of exposure. Since the PMGI is not sensitive to the 320 nm radiation used in this step, there was no effect on the PMGI.

The level 20 was then developed in the conventional way to define the pattern of openings 32 and exposed to a UV flood exposure of radiation 50 at 248 nm with an intensity of 10 mW/cm$^2$ for 10 minutes using a Hybrid Technologies Group Xe-Hg lamp flood exposure system. The resulting exposure pattern was then processed using immersion development in the Shipley SAL-101 developer for about 120–140 seconds depending upon environmental conditions such as temperature and humidity which may effect development time in a conventional fashion. This produced a pattern of openings 28 having tapered walls 29 as shown in FIG. 1D where the width of the openings 32 was approximately 1 micron and the resulting width 14 was approximately 0.25 microns.

Subsequent to the development of the lower level 20, metal 60 was deposited to form conductive gates 80 by e-beam evaporation on the substrate 10 through layers 20 and 30. The deposition was performed to produce a multilayer metal deposition of TiPtAu in conventional manner of sufficient thickness to fill the openings 28 (e.g. 100Å Ti; 1000Å Pt; 11,000Å Au). The resulting metal pattern had a cross sectional area wherein the width 14 of the metal at the interface between the lower level 20 and substrate 10 was 0.25 microns and tapered upwardly through the 1 micron opening in the upper level 30.

Figure 1F:
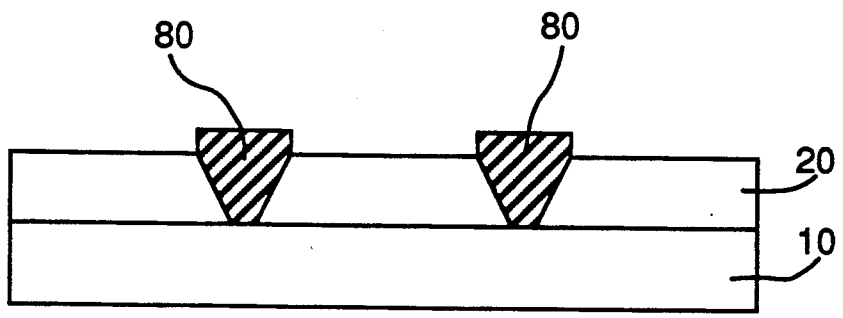
Figure 1G:
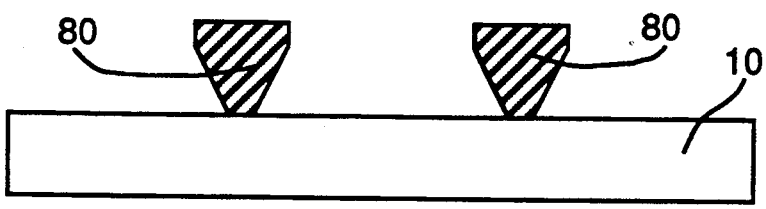

To complete the deposition, the layer 30 was dissolved and the metal 60 lifted in a conventional fashion to produce the gate structure 80 shown in FIG. 1F having low resistance for improving device performance while maintaining sub-half micron contact dimensions. The relatively wide opening (1 micron in the imaging layer 30) coupled with the depth of the pattern through lower level 20 and the slope of the walls 29 allowed a thick layer of metal to be deposited through the mask 12. This metal 80 contacts the semiconductor substrate 10 along the small 0.25 micron width 14 and then flares out to allow more metal and increased current carrying capacity.

As will be appreciated, the thickness of the PMGI layer 30 enhances the ability to deposit and then lift a thick layer of metal 60 thereby resulting in a conductive pattern 80 which is similar to that obtained in many "Tee" gate processes without the effort associated with those processes. Furthermore, because the PMGI layer 20 is low in moisture absorption, has a high glass transition temperature and is resistant to solvents and chemicals used in subsequent semiconductor processing steps, the PMGI can be left in place around the gate as shown in FIG. 1F to support the fragile interconnection during subsequent processing.

As can be seen from the above description, the present technique provides an improved process which allows optical lithographic processes to be employed in producing sub-half micron conductive patterns on substrates. The ability to obtain such sub-half micron dimensions relies on the focusing effect of a narrow mask opening in the layer 30 acting as a first zone of a Fresnel zone plate. This allows the coarsely defined 1 micron opening in the layer 30 to be reduced in the PMGI layer 20 in the example specified above to produce the 0.25 micron dimension described.

A more detailed discussion regarding the theory involved in the above process may be found in the Journal of Vacuum Science and Technology Volume 7, No. 4, July/August 1989, pages 675-679 by Pedrotti, Robinson and Vachss, which is hereby incorporated by reference in its entirety. Generally, however, it has been found that there are several factors which define the geometry for achieving the smallest pattern dimensions. It has been found that the greatest dimensional sensitivity is to the variation of the width of the pattern opening in the layer 30, followed by the thickness of the layer 20, followed by the thickness of the layer 30. However, this characteristic is conducive to use of optical lithographic processes since the width control obtainable by such optical lithographic processes and the thickness control that can be obtained in deposition for the layers 20 and 30 allow the technique to be successfully implemented in the production environment.

Although the opening width of the openings 32 in layer 30 is important to the definition of the pattern on the substrate 10, the minimum feature size is not directly related to the width as in other optical approaches. Specifically, it has been found that the most desirable development images obtained through UV flood exposure of the layer 20 can be achieved with a pattern of openings 32 having a width in the layer 30 of 0.9-1.2 microns. The widths can also be affected, as was previously noted, by controlling the thickness of the PMGI layer. Furthermore, the size of the pattern developed on layer 20 may be further reduced by changing the wavelength of the deep UV flood exposure by using, for example, a 184 nm mercury emission. This presumes that the wavelength of the 184 nm mercury emission is a wavelength to which the PMGI will be sensitive for development.

In accordance with the above structure and technique, conductive depositions having sub-half micron dimensions can be achieved using conventional contact photolithographic equipment. However, there is no reason that the same method cannot be extended to proximity or projection systems of conventional character which may be used to define the initial opening or pattern in the upper level 30. This enables the employment of production processes which are well developed in industry and accepted equipment and processes for producing devices and integrated circuits with submicron dimensions. All of this can be accomplished with significant reductions in the costs and time constraints normally associated with EBL and XPL approaches.

Although the invention has been described with reference to specific structures and materials, it is clear that there are many other modifications and variations of the present invention which are possible in light of the above teachings. For example, the invention has been described specifically with respect to PMGI and a positive photoresist material for forming the mask structure 12. However, other materials could be used to produce the mask structure in accordance with the teachings of the invention to produce the tapered depositions on a variety of substrates for devices other than those specifically described. It is therefore to be understood that within the scope of the appended claims, the invention may be practiced otherwise than as specifically described.

What is claimed is:

1. A method of masking a semiconductor substrate comprising:
    selecting a semiconductor substrate;
    depositing a first portion over said semiconductor substrate, said first portion being formed by depositing a plurality of successive layers over one another with each of said layers having a successively increasing concentration of the deposited material;
    depositing a second portion over said first portion;
    exposing said second portion to radiation to define a pattern in said second portion;
    developing said second portion to define openings through said second portion corrresponding to said pattern;
    exposing said first portion to radiation through said openings to define a tapered pattern of exposure of sub-half-micron dimensions adjacent said substrate; and
    developing said first portion to form openings tapering from the dimensions of the openings in said second portion to sub-half-micron openings at the interface between said first portion and said substrate in a pattern corresponding to the openings in said second portion.

2. The method of claim 1 wherein said step of depositing said first portion includes depositing a plurality of layers of PMGI of different concentrations and wherein said step of depositing a second portion comprises depositing a photoresist.

3. The method of claim 2 wherein said semiconductor material is gallium arsenide and said plurality of layers in said PMGI comprise a first layer deposited using a concentration of three parts of PMGI to one part solvent, a second layer deposited on said first layer, having a concentration of four parts PMGI to one part solvent and a third layer deposited on said second layer, having a concentration of five parts PMGI to one part solvent; and
    said photoresist, comprising a positive photoresist.

4. The method of claim 3 wherein said step of exposing said second portion comprises exposing said second portion to a UV radiation in the range of 320 nm, and said step of exposing said first portion comprises exposing said first portion with UV radiation having a wavelength of 245 nm.

5. The method of claim 4 wherein said openings in said second portion are formed in the range of one micron and wherein the UV and developing of said first portion openings create tapered openings from one micron tapering to 0.25 microns adjacent said substrate.

6. A method of masking a semiconductor substrate comprising:
    selecting a semiconductor substrate;
    depositing a first portion over said semiconductor substrate, said first portion being formed by depositing a plurality of successive layers over one another with each of said layers having a successively increasing concentration of the deposited material;

depositing a second portion over said first portion;

exposing said second portion to radiation to define a pattern in said second portion;

developing said second portion to define openings through said second portion corresponding to said pattern;

exposing said first level portion to radiation through said openings to define a tapered pattern of exposure of sub-half-micron dimensions adjacent said substrate; and developing said first portion to form openings tapering from the dimensions of the openings in said second portion to sub-half-micron openings at the interface between said first portion and said substrate in a pattern corresponding to the openings in said second portion;

depositing a metal in the openings formed through said first and second portions to define a metal contact on said substrate.

7. The method of claim 6 further comprising the step of dissolving the second portion and lifting the metal to produce conductive portions on said substrate in the pattern of the openings.

* * * * *